(12) United States Patent
Reynolds et al.

(10) Patent No.: US 8,961,830 B2
(45) Date of Patent: Feb. 24, 2015

(54) ELECTROACTIVE POLYMERS CONTAINING PENDANT PI-INTERACTING/BINDING SUBSTITUENTS, THEIR CARBON NANOTUBE COMPOSITES, AND PROCESSES TO FORM THE SAME

(75) Inventors: John R. Reynolds, Gainesville, FL (US); Ryan M. Walczak, Gainesville, FL (US); Andrew G. Rinzler, Newberry, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 871 days.

(21) Appl. No.: 12/445,429

(22) PCT Filed: Oct. 11, 2007

(86) PCT No.: PCT/US2007/081121
§ 371 (c)(1),
(2), (4) Date: May 13, 2009

(87) PCT Pub. No.: WO2008/046010
PCT Pub. Date: Apr. 17, 2008

(65) Prior Publication Data
US 2010/0038597 A1 Feb. 18, 2010

Related U.S. Application Data

(60) Provisional application No. 60/850,939, filed on Oct. 11, 2006.

(51) Int. Cl.
*H01B 1/00* (2006.01)
*C09D 5/24* (2006.01)
(Continued)

(52) U.S. Cl.
CPC ............... *C09D 5/24* (2013.01); *H01L 51/0054* (2013.01); *G02F 2001/1515* (2013.01); *H01B 1/24* (2013.01); *H01L 51/0043* (2013.01); *H01L 51/0039* (2013.01)
USPC ........................................................ 252/500

(58) Field of Classification Search
USPC .......... 428/220; 524/457, 458, 460, 461, 496, 524/495, 534, 547, 548, 550, 555, 556; 525/410, 417, 535, 536; 528/73, 377, 528/378, 379
See application file for complete search history.

(56) References Cited

U.S. PATENT DOCUMENTS 6,031,711 A * 2/2000 Tennent et al. ............... 361/303
6,458,909 B1   10/2002 Spreitzer et al.
(Continued)

FOREIGN PATENT DOCUMENTS

EP    1 359 121       5/2003
JP    2001-509184     7/2001
(Continued)

OTHER PUBLICATIONS

Chung, S.J., et al., "Improved-Efficiency Light-Emitting Diodes Prepared from Organic-Soluble PPV Derivatives With Phenylanthracene and Branched Alkoxy Pendents", *Advanced Materials*, 1998, pp. 684-688, vol. 10, No. 9.
(Continued)

*Primary Examiner* — Ling Choi
*Assistant Examiner* — Thuy-Ai Nguyen
(74) *Attorney, Agent, or Firm* — Wolf, Greenfield & Sacks, P.C.

(57) ABSTRACT

A composition of matter comprises a polymer with a fully conjugated backbone or a conjugated block with a plurality of binding groups connected to the backbone by a linking moiety. The binding groups permit a non-covalent binding to a graphitic surface such as a carbon nanotube. A composition of matter where an electroactive polymer with binding groups connected to a conjugated backbone through a linking moiety is bound to carbon nanotubes. Such compositions can be used for a variety of applications using electroactive materials.

18 Claims, 9 Drawing Sheets

(51) Int. Cl.
*H01B 1/24* (2006.01)
*H01L 51/00* (2006.01)
*G02F 1/15* (2006.01)

(56) References Cited

U.S. PATENT DOCUMENTS

| | | | |
|---|---|---|---|
| 7,645,400 B2 * | 1/2010 | Saitoh | 252/511 |
| 2002/0193551 A1 * | 12/2002 | Pei | 528/86 |
| 2003/0013843 A1 * | 1/2003 | Pei | 528/422 |
| 2003/0225234 A1 | 12/2003 | Jaycox et al. | |
| 2005/0158583 A1 | 7/2005 | Kim et al. | |
| 2006/0028966 A1 * | 2/2006 | Szu | 369/126 |
| 2006/0045838 A1 | 3/2006 | Lucien Malenfant et al. | |
| 2006/0054866 A1 | 3/2006 | Ait-Haddou et al. | |
| 2009/0118420 A1 * | 5/2009 | Zou et al. | 524/577 |

FOREIGN PATENT DOCUMENTS

| | | | | |
|---|---|---|---|---|
| JP | 2003-137932 | 5/2003 | | |
| JP | 2004-2849 | 1/2004 | | |
| JP | 2004-2850 | 1/2004 | | |
| JP | 2004-75980 | 3/2004 | | |
| JP | 2005-521783 | 7/2005 | | |
| JP | 2005-206838 | 8/2005 | | |
| JP | 2007-99611 | 4/2007 | | |
| WO | WO 03/086026 A2 | 10/2003 | | |
| WO | WO 2004039893 A1 * | 5/2004 | | H01B 1/06 |
| WO | WO 2004/106420 | 12/2004 | | |

OTHER PUBLICATIONS

Li, J., et al., "Organic Light-Emitting Diodes Having Carbon Nanotube Anodes", *Nano Letters*, 2006, pp. 2472-2477, vol. 6, No. 11.

Liu, M., et al., "Efficient Green-Light-Emitting Diodes from Silole-Containing Copolymers", *Chemistry of Materials*, 2003, pp. 3496-3500, vol. 15.

Russell, D.M., et al., "Efficient light harvesting in a photovoltaic diode composed of a semiconductor conjugated copolymer blend", *Applied Physics Letters*, 2002, pp. 2204-2206, vol. 80, No. 12.

Walsh, C.J., et al., "Heteroaryl Substituted Polythiophenes: Chemical and Electrochemical Syntheses and Characterization of Poly[3-(9-tris(ethylene glycol) monomethyl ether) carbonzoylthiophene]", *Macromolecules*, 1999, pp. 2397-2399, vol. 32, No. 7.

Zhao, H., et al., "Synthesis and properties of pyrene-functionalized polyacetylene. A stable helical polymer emitting fluorescence", *Polymer*, 2006, pp. 1584-1589, vol. 47, No. 5.

Andrieux, C.P. et al., "Charge transfer studies of pyrrole copolymers substituted by anthraquinone, phenothiazine or anthracene moieties," *J. Electroanal. Chem.*, 1991, pp. 235-246, vol. 318.

Lim, J. et al., "Fluorous Biphase Synthesis of a Poly(*p*-phenyleneethynylene) and its Fluorescent Aqueous Fluorous-Phase Emulsion," *Angew. Chem. Int. Ed.*, 2010, pp. 7486-7488, vol. 49.

Wang, D. et al., "A Biomimetic "Polysoap" for Single-Walled Carbon Nanotube Dispersion," *J. Am. Chem. Soc.*, 2006, pp. 6556-6557, vol. 128.

Official Action from Japanese Application No. 2009-532581 dated Jun. 19, 2012.

International Search Report from International Application No. PCT/US2007/081121 dated May 19, 2008.

Written Opinion from International Application No. PCT/US2007/081121 dated May 19, 2008.

Reyna-Gonzalez et al., "A comparative investigation between poly(1-ethynylpyrene) and poly(1,6-(3-ethynylpyrenylene)): Influence of the structure on the thermal, optical, electrochemical properties and conductivity," Synthetic Metals, 159 (2009) 659-665.

Shiotsuki et al., "Polymerization of substituted acetylenes and features of the formed polymers," Poly. Chem., 2011, 2, 1077 (2011).

Office Action from Japanese Application No. 2009-532581 dated Jun. 17, 2014.

* cited by examiner

ELECTROACTIVE POLYMERS CONTAINING PENDANT PI-INTERACTING/BINDING SUBSTITUENTS, THEIR CARBON NANOTUBE COMPOSITES, AND PROCESSES TO FORM THE SAME

CROSS-REFERENCE TO RELATED APPLICATIONS

The present application is the U.S. National Stage Application of International Patent Application No. PCT/US2007/081121, filed on Oct. 11, 2007, which claims the benefit of U.S. Provisional Application Ser. No. 60/850,939, filed Oct. 11, 2006, both of which are hereby incorporated by reference herein in their entirety, including any figures, tables, or drawings.

FIELD OF THE INVENTION

The invention relates to electroactive polymers containing pendant pi-interacting/binding substituents and related nanotube comprising polymer composites.

BACKGROUND OF THE INVENTION

Carbon nanotubes have received significant attention for technological applications because of their desirable properties which include high electrical conductivity, high carrier mobility, high mechanical strength, and ability to be processed into various forms such as fibers and thin films. Carbon nanotubes in the form of networks and films have been proposed as the electrodes for several types of devices including polymeric supercapacitors, and as transparent electrodes for organic light emitting diodes, organic photovoltaic devices and organic electrochromic devices. Also, carbon nanotube dispersions within an electroactive organic matrix, such as poly(alkylthiophene)s and poly(phenylene vinylene)s, have demonstrated potential as an electroactive component within bulk heterojunction photovoltaic devices. Recent work has also demonstrated that dispersing carbon nanotubes within an organic polymeric matrix (such as polystyrene and polyacrylates) dramatically increases, among other properties, the strength, toughness, and durability of the organic polymer. Therefore, it is anticipated that the dispersion of carbon nanotubes into electroactive organic materials to produce materials which are active in charge storing supercapacitors/batteries, solar cells, electrochromic fiber and film-based devices, and light emitting devices, aside from producing enhanced electronic properties, would result in durable and robust materials.

In such devices it is necessary to couple an organic material to the carbon nanotubes electrically. Such electrical coupling requires intimate proximity between the organic material and the nanotube surface. The nanotube surface, like the basal plane of graphite, is a low energy surface that interacts only weakly with many of the known organic materials that are most useful in such applications. This weak interaction can result in poor contact, also known as poor wetting, between the organic material and the nanotubes. For example during a deposition of the organic material onto the surface of a nanotube network electrode, the organic material can bead up along the nanotubes leaving sections of nanotube that are unevenly coated with pinholes or larger sections of nanotubes that are not covered by the organic material. Such uncovered sites can be detrimental to the device performance because, among other disadvantages, pinholes can result in electrical shorts between the nanotube and the counter electrode.

Recent work by Zhang et al. *Nano Lett.* 2006, 6, 1880-1886 and Li et al. *Nano Lett.* 2006, 6, 2472-2477 has demonstrated that in photovoltaic devices and light emitting devices, hole transport layers such as those based on PEDOT:PSS, when deposited as thin films onto carbon nanotube network electrodes, can reduce the occurrence of pinholes by planarizing the electrode surface. This deposition process essentially covers the nanotubes completely with a thick even layer of polymer. Such a deposition is a common practice for devices constructed with high surface roughness ITO/glass. However, the device performance reported was inferior to that of the ITO analogs, and well below the performance required to make such devices commercially viable. Although the deposition reduces the pinhole problem, the use of polymers such as PEDOT:PSS on carbon nanotube films displays some disadvantages including:

a) The very high effective surface area of nanotube network electrodes for charge injection is significantly reduced by planarizing the nanotube surface with PEDOT:PSS.
 b) Interfacial adhesion of the PEDOT:PSS with the carbon nanotube surface is poor, possibly due to the strongly polar and hydrophilic nature of the PEDOT:PSS.
 c) Mechanical deformations, such as shear stress and bending can induce delamination of the PEDOT:PSS from the nanotube substrate, due to the lack of affinity between the nanotube surface and the PEDOT:PSS resulting in damage or destruction of the device.
 d) The strongly acidic poly(styrenesulfonic acid) matrix of PEDOT:PSS can promote device decomposition.

An alternative approach to PEDOT:PSS deposition for resolution of the pinhole problem is the coating of the nanotubes with a thin layer of parylene as disclosed by Aguirre et al. *Appl. Phys. Lett.* 2006, 88, 183104 in an electroluminescent device. Although parylene provides a coating that improves the coupling of the organic layer to the nanotube surface, it is an insulator and blocks electron and hole transport across the nanotube/organic layer. Devices containing dielectric polymer layers require higher voltages to permit current flow through the insulating layer increasing the device turn-on and operating voltages. This higher voltage increases the likelihood of device decomposition through Joule heating or other pathways and can also require high power for operation. The higher power and heating are two characteristics that are undesirable for electroluminescent devices such as displays.

Recent efforts have addressed the poor interface between organic materials and carbon nanotubes in a number of ways. For example, covalent functionalization of the carbon nanotube surface has been shown to improve the dispersion of poly(3-octylthiophene) and $C_{60}$ in bulk heterojunction solar cells by covalently modifying the carbon nanotube side-wall. Unfortunately, device performance was poor, as chemical modification of the carbon nanotube side-wall introduces conjugation disrupting defects that decreases their conductivity.

An alternative method for improving the interface between organic molecules and carbon nanotubes has been through non-covalent functionalization with pi interacting organic molecules. Substituted polycyclic aromatic hydrocarbons, generally being pyrene or related derivatives, have been shown to provide non-covalent interaction with the nanotubes to permit association of other molecules with the nanotubes while minimally impacting intrinsic electronic transport properties. Such non-covalent functionalization of carbon nanotubes in photovoltaic devices has been explored by employing monomeric pyrene derivatives that are cationic quaternary ammonium salts adsorbed to the surface of carbon nanotubes, followed by a layer-by-layer deposition of an anionic polythiophene derivative to form a composite material. The resulting composite photovoltaic device exhibited modest performance.

Applications that rely on small-molecule pyrene derivatives associating with nanotube surfaces are limited by the association/dissociation kinetics of pyrene from the nanotube surface. Essentially, when a monomeric pyrene moiety dissociates from the nanotube surface, it can diffuse away from the nanotube and can be essentially lost to the system. Inevitably, monomeric pyrene derivates can dissociate from a nanotube surface over time, especially in solution or in the case of a high electric field device where an ionic pyrene derivative can migrate towards an oppositely charged electrode, destabilizing the interface between an electroactive polymer and a nanotube. In contrast to monomeric pyrene derivatives, an oligomeric or polymeric derivative with multiple pyrene moieties per polymer associated with the nanotube surface could possess many orders of magnitude higher association constants to that of a monomeric moiety. This enhanced association of a polymeric moiety has been demonstrated in a few examples using non-conjugated polymeric systems such as poly(methyl methacrylate) and polystyrene as disclosed in Lou et al. *Chem. Mater.* 2004, 16, 4005-4011. Wang et al. *J. Am. Chem. Soc.* 2006, 128, 6556-6557. These systems focused on enhancing the dispersion of nanotubes into solvents and demonstrate that polymeric derivatives containing multiple pyrene derivatives exhibit extremely stable non-covalent interactions with carbon nanotubes. This affinity is so strong that, in one example, the nanotube/polymer material was reported to have had to be heated to over 250° C. to essentially "burn off" the polymer.

A need remains for a system where electroactive, conjugated, or conducting polymers (CPs) have high association constants with carbon nanotubes, and a process to provide the same. Such a material would be useful as CP/nanotube composite materials for electroactive and related devices including: electroluminescent devices; photovoltaics; electrochromic films and fibers; field-effect transistors; batteries; capacitors; and supercapacitors.

SUMMARY OF THE INVENTION

An electroactive material comprised of an oligomer or polymer in which the backbone has at least one conjugated block and a plurality of pendant binding groups linked to the backbone by a linking moiety can allow the formation of a composite with carbon nanotubes or other graphene materials by binding to the surface without formation of a covalent bond. The pendant binding group can be a planar pi-bond containing organic molecule such as a polycyclic aromatic. The backbone of the oligomer or polymer can be fully conjugated, in that the conjugation extends essentially the entire length of the backbone, or the conjugated units can be in blocks of the backbone. The electroactive material can be electrically conductive. The oligomer/polymer can be a poly (3,4-alklyenedioxythiophene) or other polyheterocyclic aromatic oligomers/polymer. The polymer can be a polyfluorene or other aromatic hydrocarbon oligomers/polymer. The linking moiety can permit the binding group to associate with the graphene surface where at least some of the geometric constraints of the backbone are decoupled from the binding groups. The linking moiety can be non-conjugated or conjugated.

The electroactive oligomer/polymer can be combined with a plurality of carbon nanotubes and stabilized by non-covalent bonds between the pendant binding group and the surface of the nanotubes. The polymer-nanotube composition can be in the form of dispersed coated nanotubes or a coated nanotube film.

BRIEF DESCRIPTION OF THE DRAWINGS

A fuller understanding of the present invention and the features and benefits thereof will be obtained upon review of the following detailed description together with the accompanying drawings, in which.

DETAILED DESCRIPTION

Figure 1:
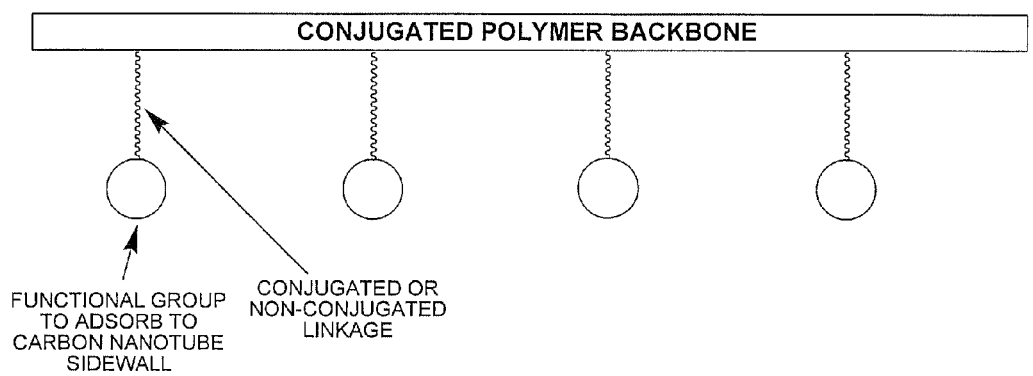
FIG. 1 is a schematic illustration of a generalized polymer composition according to an embodiment of the invention.

FIG. 1 shows a schematic illustration of a generalized oligomer/polymer (hereafter referred to as polymer) composition according to an embodiment of the invention. The polymer composition includes an electrically conductive polymer having a conjugated backbone or a backbone with at least one conjugated block, a plurality of pendant binding groups, and a linking moiety connecting the pendant group(s) to the backbone of the electrically conductive polymer. The pendant binding groups can be linked to either a conjugated or non-conjugated repeating unit of the electroactive polymer.

The polymer backbone can be fully conjugated and the polymer can be an electroactive polymer. An electroactive polymer as used herein can be defined as: a polymer (1) whose electronic and/or optical properties can be measurably modified by application of an electric field; (2) that is redox active; (3) that is electrically conducting or semiconducting; (4) that undergoes electron and/or hole transport; and/or (5) that can form charge carriers upon the application of a stimulus such as photoexcitation.

The polymer backbone can include aromatic hydrocarbon units (such as phenylene, fluorene, phenylene vinylene units), heterocycle units (thiophene, pyrrole, and furan units), and/or other pi-conjugated units. Some or all of the aromatic hydrocarbon units may be unsubstituted, substituted, or multiply substituted. The linking moiety can be conjugated or non-conjugated.

When used to form a nanotube composite, the binding pendant group will be non-covalently bound to the sidewalls of carbon nanotubes, such as polycyclic aromatics which bind through pi-stacking interactions, although other non-covalent associative forces can be used to bind with the carbon nanotubes. Unlike covalent bonding, the binding between a binding group and a nanotube, such as pi stacking, does not disrupt the nanotube structure sufficiently to alter or compromise the nanotube properties including electrical conductivity. Hereinafter, polymers according to the invention with a plurality of pendant binding groups are referred to as "Sticky Polymers" based on their affinity to bind or "stick" to carbon nanotubes. Carbon nanotubes can be single wall nanotubes (SWNTs) or multiwall nanotubes (MWNTs), or mixtures thereof.

Examples of conjugated polymers or polymeric segments that can be used with the invention include, but are not limited to: polythiophene, polypyrrole, polydioxythiophene, polydioxypyrrole, polyfluorene, polycarbazole, polyfuran, polydioxyfuran, polyacetylene, poly(phenylene), poly(phenylene-vinylene), polyaniline, polypyridine, and polyfluorene. This polymer construction may be a homopolymer or a copolymer where the entire length of the backbone is conjugated (fully conjugated), or the polymer can be a block copolymer where the polymer backbone can have non-conjugated segments in addition to conjugated segments of sufficient size to be electroactive, which can be from an average of about three repeating units for some applications of the material to about 20 or more for other application of the material. At any repeating unit of the polymer backbone, for example on a pendant group, there may exist additional functionality for electron or hole transport cross-linking, photoresponse, and/or ionic or other physical interactions that may contribute toward the desired function of the polymer. Desired functions may include, but are not limited to, increased compatibility with device components, optimized energy and carrier transport, increased ease of processability, and enhanced mechanical properties. Although the electroactive polymer backbone may associate or non-covalently bond with carbon nanotubes, it is the non-covalent bonding of the pendant groups of the sticky polymer that controls the association of the polymer with the nanotubes and no association of any type between the polymer backbone is required. The pendant groups can preferentially bond with the nanotubes over bonding of the polymer backbone and partially or completely displace any non-covalent bonding between the polymer backbone and the nanotubes.

Electroactive polymers that do not have sufficient capability to interact with carbon nanotubes to form stable associations, are intrinsically repulsive of carbon nanotubes, or are otherwise incompatible with carbon nanotubes can be forced into association with the carbon nanotube by the non-covalent association of the pendant binding groups. This aspect of the invention permits the association of the electroactive polymer to the nanotube independently of the intrinsic property of the polymer as the strong non-covalent interaction of the pendant binding substituents can be solely relied upon for association of the polymer with the nanotube.

Examples of non-conjugated linking moieties that can be used to link the polymer to the binding groups include, but are not limited to alkyl chains, ether chains, cyclic linking groups, and any other moiety that does not result in conjugation between the polymer backbone and a binding group. In another embodiment of the invention, conjugated linking moieties can be used exclusively or can be used in combination with non-conjugated linking moieties. Non-limiting examples of conjugated linking moieties include vinylene, ethynylene, phenylene, and combinations thereof. The conjugated linking moieties can also contain heteroatoms, such as S, N, O, and Si.

Linking moieties can be monomeric, oligomeric or polymeric with 1 to 100 atoms within the linking moiety between the polymer backbone and the binding unit, generally being 1-20 atoms in length. Linking moieties that are greater than about 20 atoms in length can be formed by a graft polymerization method. The length of the linkage can have a significant impact on the properties of the coated nanotube. Properties of the composition can be selected or modified by the choice of the length of the linking moiety. Therefore, depending on the application, it may be desirable to have short or relatively long length linkers. The linking moieties need not be of a single length or even of a monomodal distribution of lengths. In some embodiments it can be advantageous to have a plurality of specific moiety lengths or bimodal or polymodal distribution of lengths.

As indicated above the polymer can have blocks that are not conjugated between conjugated blocks. These non-conjugated blocks may be of similar structure to that of non-conjugated linking groups. Furthermore, the conjugated and the non-conjugated repeat units of the blocks can be substituted with the pendant groups for binding or substituted with groups that do not contain pendant groups for binding. The substituents, the non-conjugated blocks and the non-conjugated linking groups can be or contain alkyl, alkylene, substituted alkylene, aryl and substituted aryl groups or non-conjugated polymeric groups.

Alkyl groups can be a straight or branched chain of, for example, 1-24 carbon atoms and can be, for example, methyl, ethyl, n-propyl, n-butyl, sec-butyl, tert-butyl, n-hexyl, n-octyl, 2-ethylhexyl, n-nonyl, n-decyl, n-undecyl, n-dodecyl, n-tridecyl, n-tetradecyl, n-hexadecyl, n-octadecyl or dodecanyl. Alkylene is a chain of, for example, 1-12 carbon atoms and can be, for example, methylene, ethylene, propylene, butylene, pentalene, hexylene, octylene, 2-ethylhexyl, n-nonyl, n-decylene or dodecylene and the like; for example, methylene, ethylene, propylene or butylene.

The alkyl or alkylene may be interrupted one or more times by one or more oxygen atoms, sulfur atoms, —SO—, —SO$_2$—, carbonyl, —COO—, —CONH—, —NH—, —CON(C$_{1-8}$ alkyl)- or —N(C$_{1-8}$ alkyl)- and the like. For example, the alkyl group may be interrupted one or more times by one or more oxygen atoms, sulfur atoms, carbonyl, —COO—, —NH— or —N(C$_{1-8}$ alkyl)-. The uninterrupted or interrupted alkyl or alkylene may also be substituted one or more times by, for example, one or more C$_{3-6}$ cycloalkyl groups, halogen, —OR, —COOR, —COOM, —SO$_3$M, —SO$_3$H, phosphonic acid, halogen, —CONR'R, —NR'R, phosphonate salt, ammonium salt or group wherein R and R', independently any alkyl group indicated above or hydrogen, the substituent may be a group of the structure a group -L-Ar, C(O)-L-Ar, or C(O)O-L-AR, C$_{1-24}$ alkyl, C$_{3-24}$ alkenyl, C$_{3-6}$ cycloalkyl or C$_{1-24}$ alkylcarbonyl which are uninterrupted or interrupted one or more times by one or more oxygen atoms, sulfur atoms, carbonyl, —COO—, —CONH—, —NH—, —CON(C$_{1-8}$ alkyl)- or —N(C$_{1-8}$ alkyl)-, which are uninterrupted or interrupted alkyl, alkenyl, cycloalkyl or alkylcarbonyl are unsubstituted or substituted one or more times by one or more halogen, —OH, C$_{7-12}$ aralkyl, C$_{2-12}$alkylcarbonyl, C$_{1-24}$alkoxy, C$_{2-24}$alkylcarboxy, —COOM, —CONH$_2$, —CON(H)(C$_{1-8}$ alkyl), —CON(C$_{1-8}$ alkyl)$_2$, —NH$_2$, —N(H)(C$_{1-8}$ alkyl), —N(C$_{1-8}$ alkyl)$_2$, —SO$_3$M, phenyl, phenyl substituted one or more times by one or more C$_{1-8}$ alkyl, naphthyl, naphthyl substituted one or more times by one or more C$_{1-8}$ alkyl ammonium salt, phosphonic acid or phosphonate salt or when attached to a nitrogen atom, R and R', together with the nitrogen atom to which they are attached, form a 5-, 6- or 7-membered ring which is uninterrupted or interrupted by —O—, —NH— or —N($C_{1-12}$ alkyl)-. L is a direct bond or $C_{1-12}$ alkylene which can be uninterrupted or interrupted by one or more oxygen atoms and is unsubstituted or substituted one or more times by one or more —OH, halogen, $C_{1-8}$ alkyl, $C_{1-24}$ alkoxy, $C_{2-24}$alkylcarboxy, —$NH_2$, —N(H)($C_{1-8}$ alkyl), —N($C_{1-8}$ alkyl)$_2$ or ammonium salt). Ar is $C_{6-10}$ aromatic or $C_{1-9}$ saturated or unsaturated heterocycle which can be unsubstituted or substituted one or more times by one or more halogen, —OH, $C_{1-24}$ alkoxy, $C_{2-24}$ alkylcarboxy, —COOQ", —$CONH_2$, —CON(H)($C_{1-8}$ alkyl), —CON($C_{1-8}$ alkyl)$_2$, —$NH_2$, —N(H)($C_{1-8}$ alkyl), —N($C_{1-8}$ alkyl)$_2$, —$SO_3M$, $SO_3H$, ammonium salt, phosphonic acid, phosphonate salt, $C_{1-24}$ alkyl which is unsubstituted or substituted one or more times by one or more halogen, wherein Q" is hydrogen, metal cation, glycol ether, phenyl or benzyl, or phenyl or benzyl substituted one or more times by one or more halogen, hydroxy, $C_{1-24}$ alkoxy or $C_{1-12}$ alkyl.

Additionally, alkylene or interrupted alkylene may also be substituted by a group -L-Ar, C(O)-L-Ar, or C(O)O-L-AR, $C_{1-24}$ alkyl, $C_{3-6}$ cycloalkyl or $C_{1-24}$ alkylcarbonyl which are uninterrupted or interrupted one or more times by one or more oxygen atoms, sulfur atoms, carbonyl, —COO—, —CONH—, —NH—, —CON($C_{1-8}$ alkyl)- or —N($C_{1-8}$ alkyl)-, which uninterrupted or interrupted alkyl, cycloalkyl or alkylcarbonyl are unsubstituted or substituted one or more times by one or more halogen, —OH, $C_{7-12}$ aralkyl, $C_{2-12}$alkylcarbonyl, $C_{1-24}$alkoxy, $C_{2-24}$alkylcarboxy, —COOM, —C(O)$NH_2$, —CON(H)($C_{1-8}$ alkyl), —CON($C_{1-8}$ alkyl)$_2$, —$NH_2$, —N(H)($C_{1-8}$ alkyl), —N($C_{1-8}$ alkyl)$_2$, —$SO_3M$, phenyl, phenyl substituted one or more times by one or more $C_{1-8}$ alkyl, naphthyl, naphthyl substituted one or more times by one or more $C_{1-8}$ alkyl, ammonium salt, phosphonic acid or phosphonate salt or when attached to a nitrogen atom, R and R', together with the nitrogen atom to which they are attached, form a 5-, 6- or 7-membered ring which is uninterrupted or interrupted by —O—, —NH— or —N($C_{1-12}$ alkyl)-. Aryl or substituted aryl, for example, is a group as described above for the group Ar.

Non-conjugated polymeric units includes polyesters, polyamides, polyurethanes, polyureas, polycarbonates, polyaryletherketones, polyarylsulfones, polyolefins, polyacrylates, polymethacrylates, polystyrenes, polyacrylamides, polyalkadienes, polyvinylethers, polysiloxanes, polypeptides, polysaccharides. The architecture of the backbone can be linear, branched, hyperbranched, star-shaped and dendritic. These polymers contain pendant and/or end groups comprised of alkyl, substituted alkyl, alkylene, substituted alkylene, aryl, or substituted aryl.

Figure 2:
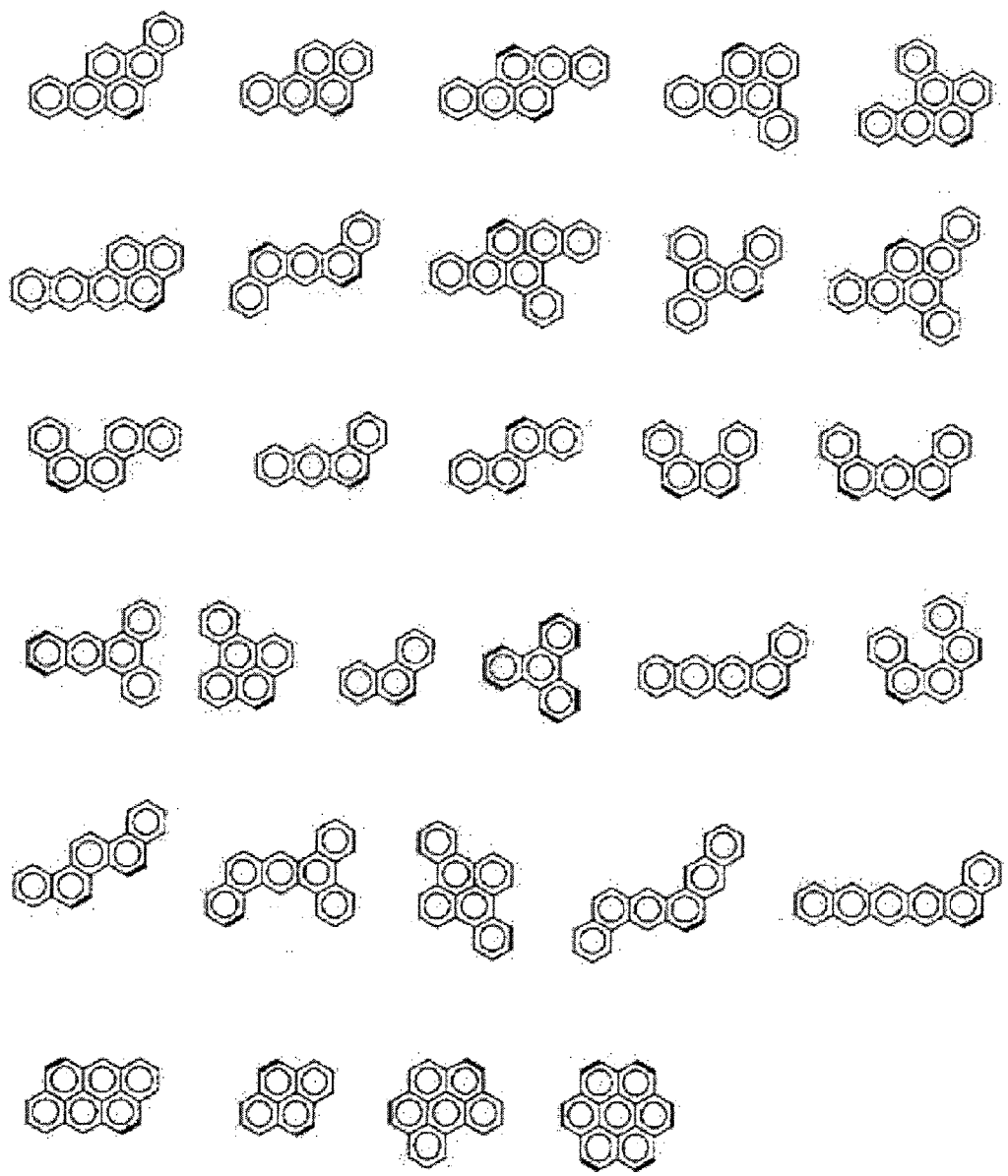
FIG. 2 illustrates the chemical structure of a variety of graphene sheet groups that can be incorporated as the pendant binding groups according to an embodiment of the invention.

A variety of pendant binding groups can be used with the present invention. Examples of the pendant functional groups that can be used for non-covalently binding with the carbon nanotubes, include, but are not limited to pyrene, anthracene, pentacene, benzo[a]pyrene, chrysene, coronene, corannulene, naphthacene, phenanthrene, triphenyklene, ovalene, benzophenanthrene, perylene, benzo[ghi]perylene, antanthrene, pentaphene, picene, dibenzo[3,4;9,10]pyrene, benzo[3,4]pyrene, dibenzo[3,4;8,9]pyrene, dibenzo[3,4;6,7] pyrene, dibenzo[1,2;3,4]pyrene, naphto[2,3;3,4]pyrene, and porphyrin derivatives. Pendant binding groups can be any graphene sheet, where examples are displayed in FIG. 2. The pendant binding group can be on every repeating unit of the polymer, on alternating repeating units of the polymer, randomly or regularly positioned on two or more repeat units of a polymer. The pendant binding groups can be connected to repeating units of a conjugated block or a non-conjugated block. A plurality of pendant binding groups can be connected to a single repeating unit of the polymer.

The invention also includes the process of attaching the Sticky Polymers to carbon nanotube, or related graphite-like surfaces. The presence of the pendant binding groups (hereinafter the "Sticky Groups") extending from the polymer backbone according to the invention allows the polymer to form a strong interaction (enhanced interface) with the carbon nanotubes. In one embodiment the Sticky Polymer can be viewed as a coating, where the backbone can attain a highly conjugated state with controlled and often limited steric interruptions imposed by the binding of the Sticky Groups. A process described below provides an exemplary method of coating the nanotubes. The Sticky Polymers according to the present invention may have commercial application by themselves. For example, such polymers can be used as a chromophore, lumophore, or a charge transporting moiety. In addition to electroactive components, the polymers may include other covalently bound functional components such as pigments, dyes, and UV stabilizers Materials derived from the process of combining the Sticky polymers with the nanotubes (hereinafter "Coated Nanotubes") can be divided into two subclasses: (i) individual nanotubes or nanotube bundles in their dispersed form that have been subjected to the process (hereinafter "Dispersed Coated Nanotubes") and (ii) already-formed carbon nanotube films which are subsequently coated by the process (hereinafter "Coated Nanotube Films").

Materials according to the present invention provide significant advantages over known compositions and provide some unique features. For example, a number of scientific investigations are underway to replace indium tin oxide (ITO) coated glass (an expensive, non-renewable, chemical material made under a hazardous chemical refining process) with new technology combining conjugated and/or electroactive polymers with carbon nanotube films. Electrically conducting polymers combine the desirable physical properties of plastics, such as toughness, high mechanical strength, heat resistance, light weight, and ability to be safely produced on a very large scale, with customizable electronic effects such as emission of light, color change, and electrical conductivity. The interaction between the carbon nanotube films and conjugated polymers allow electrical conductivity in a low power format with an optical transparent material with the potential to replace indium tin oxide (ITO) coated glass used in traditional displays.

Published U.S. Application No. 20040197546 (hereafter '546) to Rinzler et al., is entitled "Transparent Electrodes from Single Wall Carbon Nanotubes" teaches the preparation of optically transparent electrical conductive nanotube films and methods for forming such films. More specifically, '546 describes a low temperature method of forming substantially optically transparent and electrically conductive single wall nanotube (SWNT) films. SWNTs are uniformly suspended in solution generally aided by a stabilizing agent (e.g. surfactant) followed by the deposition of the nanotubes onto the surface of a porous filtration membrane that possesses a high density of pores that are too small for the majority of the SWNTs to pass through. The nanotube film forms as an interconnected and uniform layer having the SWNTs generally lying on and being parallel to the membrane surface as the liquid is filtered away.

In one embodiment, a solution suspending SWNTs is vacuum filtered from the SWNT to form a film on the filter membrane surface. Any remaining surface stabilizing agent can be subsequently washed from the film and can then be allowed to dry. Significantly, the nanotubes are in intimate contact with each other (consolidated) throughout the body of the SWNT film after washing and drying. The nanotube film formed in this manner has one side intimately attached to the filtration membrane while the other side is only in contact with air or another gas. The nanotube film can be transferred to a desired substrate followed by the removal of the membrane. This is accomplished by first adhering the free side of the nanotube film opposite of the membrane to a desired substrate using pressure or in some other manner, followed by dissolving the filtration membrane in a solvent. As described in the Examples below, Sticky Polymers can be bound to nanotube film using a solvent-based or electrochemical polymerization-based process.

Regarding the coated nanotube films, a wide variety of products are expected to be made possible by composite materials according to the present invention. Exemplary products include: organic light emitting diodes and displays (OLEDs); photovoltaic cells; electrochromic devices and displays; field effect transistors; and supercapacitors, capacitors, and batteries. Regarding use as displays, as consumer display products become larger, they are increasingly more difficult for consumers to physically transport and position due to the use of heavy glass screens. Replacing them with light weight plastic displays has the potential to be environmentally friendly, energy efficient, and cost effective. Additionally, displays according to the invention can be developed to be tough and bendable, and be operated on curved walls and other surfaces. The transparent, conducting carbon nanotube films described herein have utility in next generation of electronic materials in applications especially, but not limited to those listed above.

Dispersed coated nanotubes and coated nanotube films according to the present invention are also expected to have application to biological systems. Electrode materials are currently being used in contact with biological systems as bio-sensors, bio-detectors, drug and other active molecule release agents, and electrical charge stimulating devices, such as neural network electrodes. The interface between the conductive electrode and the biological system is the crucial point for exchange of information and for biocompatibility. Polymer coatings provide one means in which to provide an enhanced and more stable interfacial interaction. The Sticky Polymer CNT materials according to the present invention can provide an alternative to materials currently used in this field. In addition to the pendant binding groups, these polymers can have functionality, such as oligooxyethylene, to provide biocompatibility and cell adhesion, while also containing groups that provide specific interactions with the biosystem (such as DNA complements for bio-sensors).

Dispersed electroactive polymer coated nanotubes and nanotube films according to an embodiment of the invention are also expected to mechanically and electrically alter other materials. For example, it is well known that addition of carbon nanotubes to elastomeric materials enhances properties such as strength, durability, and flame retardant properties. The electroactive polymer coated nanotubes, when dispersed into elastomers or films as fillers or laminate additives, can provide further enhancements to the elastomers. An elastomer otherwise incompatible with carbon nanotubes may be successfully combined with electroactive polymer coated nanotubes when the Sticky Polymer also acts as an interfacial compatibilizer, and that the subsequent composite would exhibit the desired electroactive properties imparted into the Sticky Polymer. In another embodiment of the invention; a polysaccharide can be covalently bound as a pendant group onto the Sticky Polymer and electroactive polymer coated nanotubes can be incorporated into paper to impart electrical conductivity. Such a specialty additive, for example, could be used for anti-counterfeiting security features in currency due to the Sticky Polymer's electroactive component when deposited on the paper of the currency.

EXAMPLES

It should be understood that the Examples described below are provided for illustrative purposes only and do not in any way limit the scope of the invention.

Examples of "Sticky Polymers"

Figure 3:
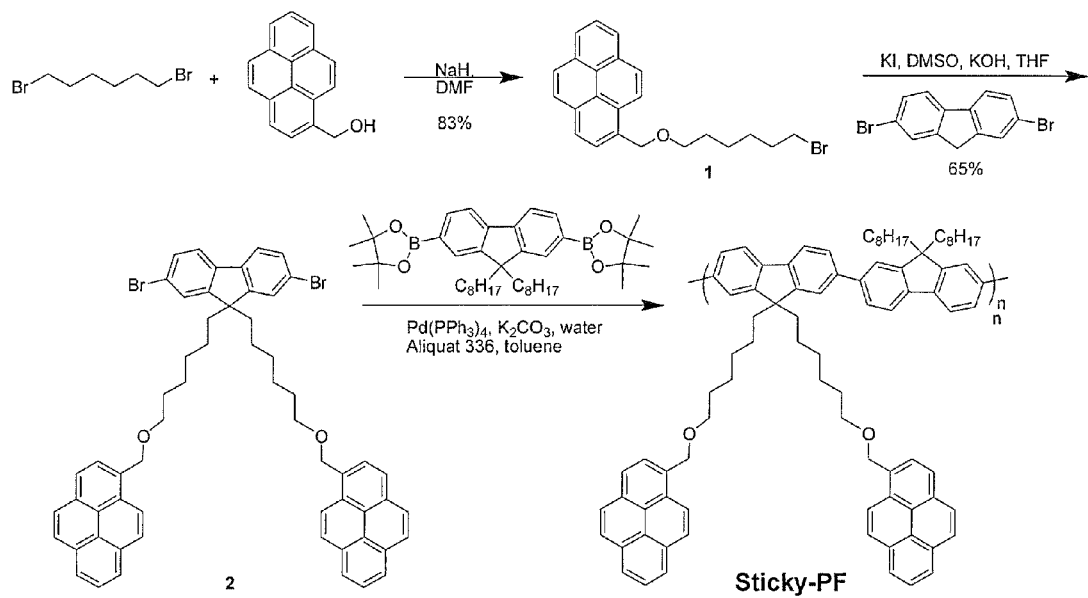
FIG. 3 is an equation of an exemplary synthesis for forming "sticky polymers" according to an embodiment of the invention.

Polyfluorene derivatives are commonly used in organic light emitting devices (OLEDs) and have been shown to emit blue light for thousands of hours with high color and brightness stability. The synthesis of Sticky Polymer "Sticky-PF", a pyrene-containing polyfluorene derivative, shown in FIG. 3 as compound 2 is described relative to FIG. 3. Synthesis began with the reaction of the commercially available reagents 1,6-dibromohexane, 1-pyrenemethanol, sodium hydride (60% dispersion in mineral oil), and N,N-dimethylformamide (DMF). After column chromatography, compound 1 was isolated in 83% yield. Compound 1 was then reacted with 2,6-dibromofluorene by a previously reported procedure [Pasini, M.; Destri, S.; Porzio, W.; Botta, C.; Giovanella, U. *J. Mater. Chem.* 2003, 13, 807] to obtain compound 2 in moderate yield after column chromatography. Monomer 2 was then reacted with 2,2'-bis(pinacolato)-9,9-dioctyl-9H-fluorene, whose synthesis is previously reported, [Pasini, M.; Destri, S.; Porzio, W.; Botta, C.; Giovanella, U. *J. Mater. Chem.* 2003, 13, 807-813] under Suzkui polymerization conditions [Cho, N. S.; Park, J. H.; Lee, S. K.; Lee, J.; Shim, H. K.; Park, M. J.; Hwang, D. H.; Jung, B. J. *Macromolecules* 2006, 39, (1), 177-183.] to yield Sticky-PF in 90-99% yield, $M_n$~15,000 Da.

Figure 4:
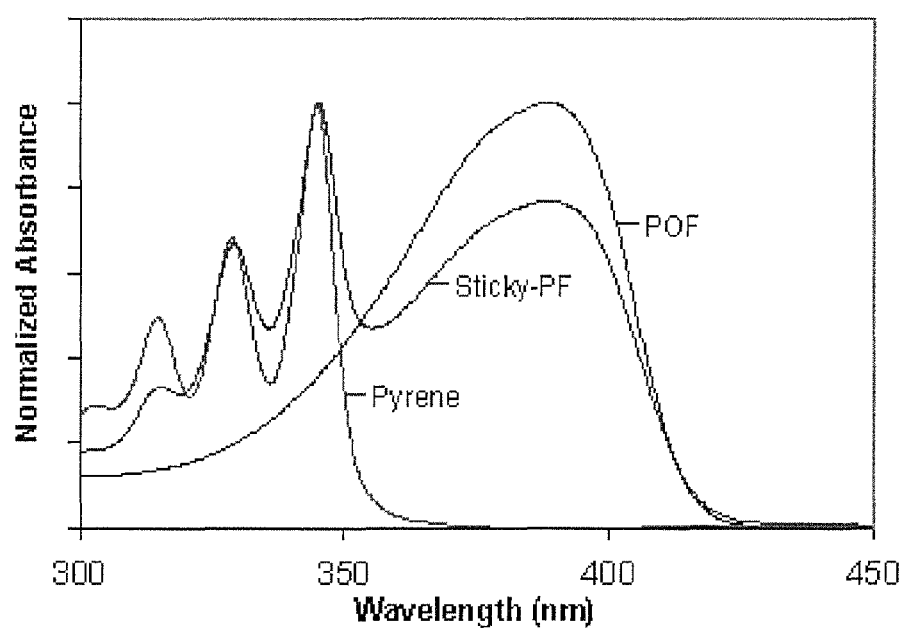
FIG. 4 is a UV-Vis spectrum for poly(9,9-dioctylfluorene), pyrene, and Sticky-PF.

FIG. 4 is a UV-Vis spectrum of a "non-Sticky" derivative, poly(9,9-dioctylfluorene) ("POF"), compound 1, and Sticky-PF. It can be seen that the Sticky-PF spectrum is a true hybrid of the absorption characteristics of both polyfluorene and pyrene.

Figure 5:
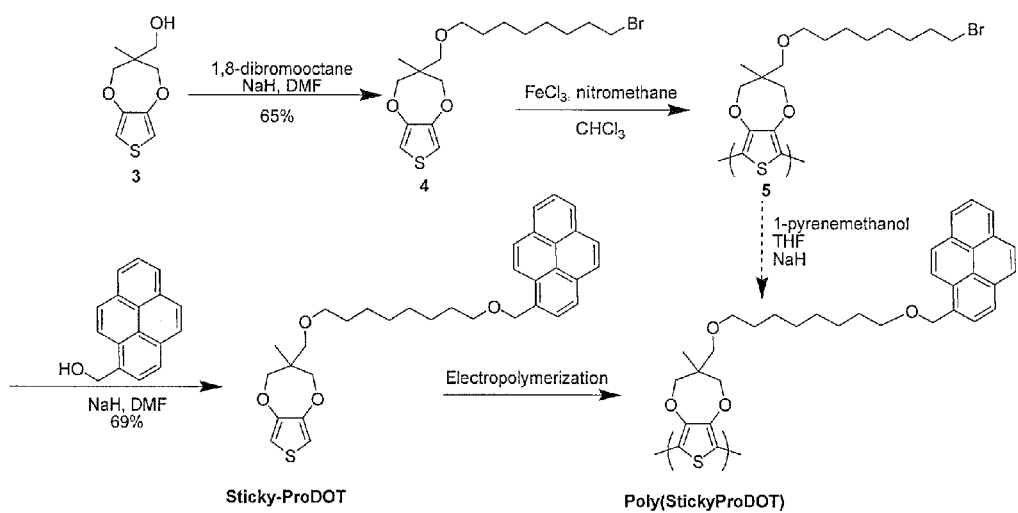
FIG. 5 is an equation of an exemplary synthesis for Poly (StickyProDOT).

Another example of a Sticky Polymer is Poly(StickyProDOT), a "Sticky" derivative of poly(3,4-alkylenedioxythiophene). Poly(3,4-alkylenedioxythiophene) derivatives are well-known for their desirable electrochromic properties, high HOMO levels, and high charge carrier mobilities. An exemplary synthesis of Poly(StickyProDOT) is shown in FIG. 5. Synthesis began with compound 3 (produced by a previously reported procedure [Walczak, R. M.; Cowart, J. S., Jr.; Abboud, K. A.; Reynolds, J. R. *Chem. Commun.* 2006, (15), 1604-1606.]), and the commercially available compounds 1,8-dibromooctane, sodium hydride, and DMF to yield compound 4 in good yield after column chromatography. Compound 4 was subsequently reacted in a similar fashion with the commercially available 1-pyrenemethanol in moderate yields after column chromatography to produce the monomer StickyProDOT. This monomer was subsequently electropolymerized (described below) onto bare carbon nanotube films to yield Sticky Polymer Poly(StickyProDOT) in a Coated Nanotube Film.

An alternative route toward Poly(StickyProDOT) is as follows: compound 4 was oxidatively polymerized with ferric chloride to produce polymer 5. Subsequent functionalization with 1-pyrenementhanol can provide a direct route to chemically prepared Poly(StickyProDOT), which is viable for large-scale production.

Examples of the Process

This exemplary Process describes the coating of a carbon nanotube film with Sticky-PF: The nanotube film is wetted by soaking in a dilute solution of Sticky-PF in solvent for a period of time. The resulting film is washed by soaking in fresh solvent to wash away excess Sticky-PF, unbound pyrene or other cyclic aromatic pendant group. The film is then washed with a non-solvent for the Sticky-PF by dipping in, for example, methanol and dried by blowing air or another gas over the film. Alternately the film can be dried by application of a vacuum.

Exemplary Process Used for Coating a Carbon Nanotube Film with StickyProDOT

A propylene carbonate solution of StickyProDOT (10 mM), tetrabutylammonium perchlorate ("TBAP", 0.1M) was prepared in the following manner. The solution was transferred to a three electrode cell comprising of a hare carbon nanotube film on MYLAR as the working electrode, a platinum flag counter electrode, and an Ag/Ag$^+$ reference electrode. A potential of 0.95 V (vs. reference) was applied to the working electrode for approximately 30 seconds. The resulting Coated Nanotube Film was transferred to monomer-free propylene carbonate/TBAP and electrochemically characterized.

Specific Examples of "Coated Nanotube Films" and their Usages

Figure 6:
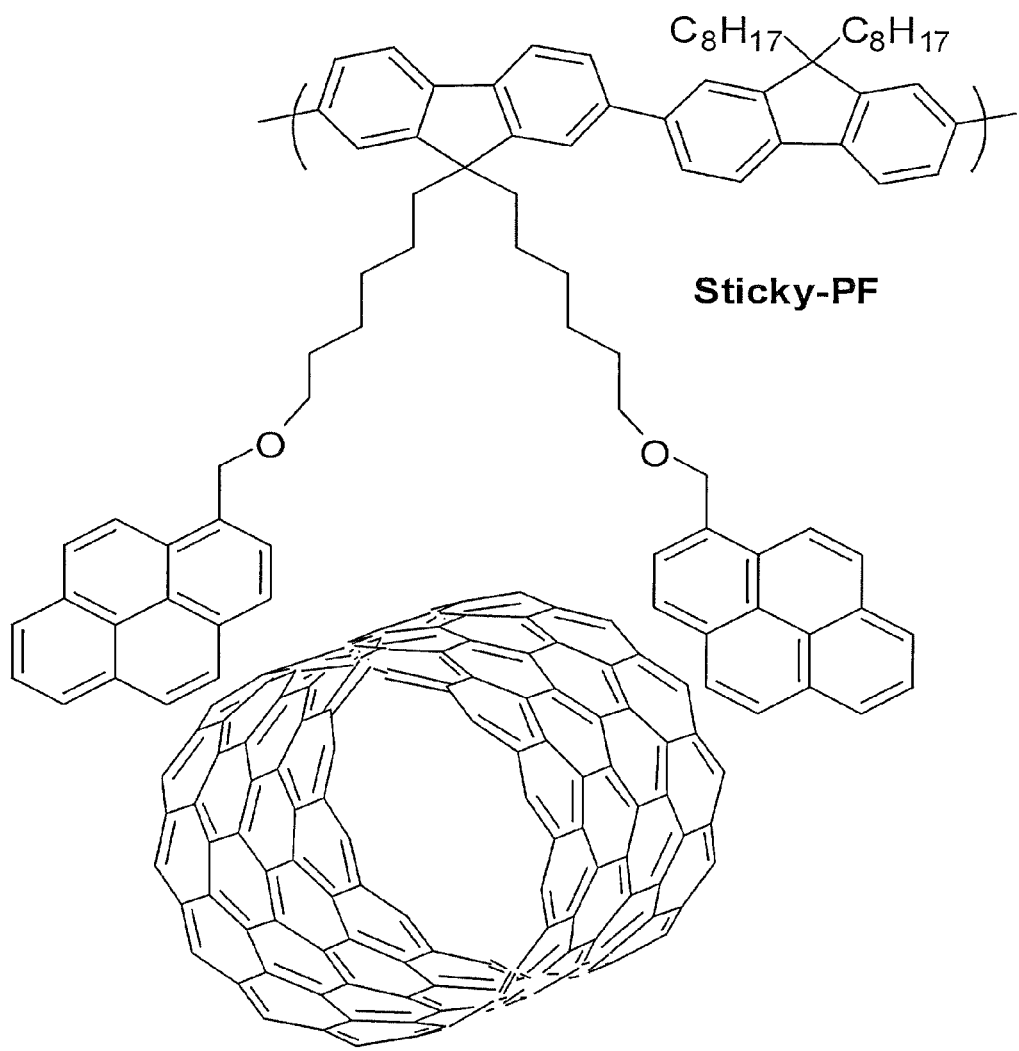
FIG. 6 is a schematic representation of Sticky-PF (top) coating a carbon nanotube (bottom) according to an embodiment of the invention.
Figure 7:
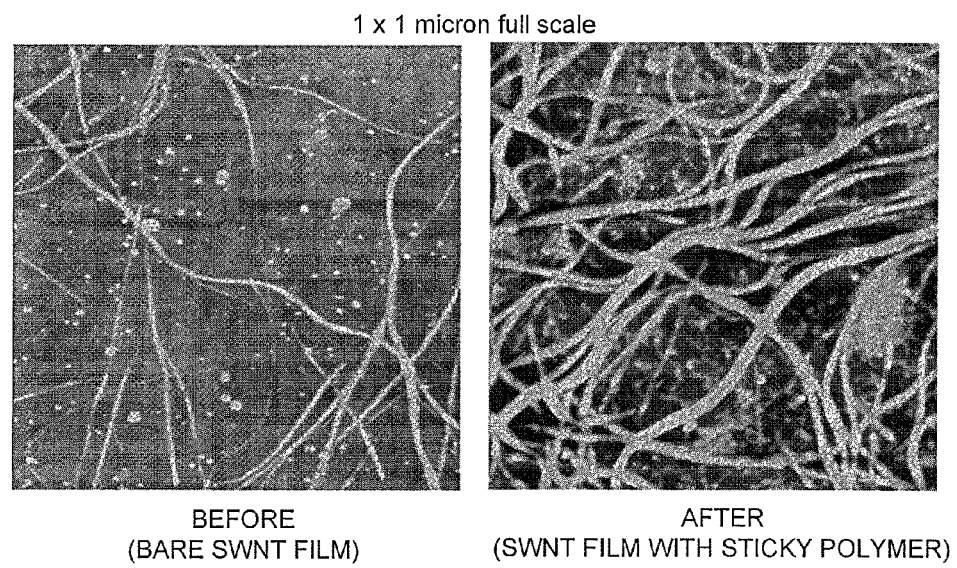
FIG. 7 are scanned atomic force microscope (AFM) images of dilute single-wall carbon nanotube films on a silicon dioxide substrate before (left) and after (right) coating with Sticky-PF.

The Coated Nanotube Film containing Sticky-PF was prepared as described above. FIG. 6 illustrates one possible representation of how the polycyclic aromatic hydrocarbon pendant groups of Sticky-PF can coat the carbon nanotube surface. The presence of multiple pyrene substituents can provide multiple anchoring sites for the polymer. FIG. 6 is a schematic representation of a Sticky-PF coating a carbon nanotube. FIG. 7 illustrates an example of how the Process described for Sticky-PF can produce a Coated Nanotube Film. The picture on the left ("BEFORE") represents a dilute film of hare carbon nanotubes on a silicon dioxide substrate (the linear/curvy objects are nanotubes or nanotube bundles). The picture on the right ("AFTER") represents the same film which has been subjected to the Process for Sticky-PF. A significant diameter change of about a factor of two (2) in the bundles and individual nanotubes indicates that a Coated Nanotube Film having Sticky-PF thereon was formed. Furthermore, it can be seen that this coating appears to be very even and homogeneous, demonstrating by example that Sticky Polymer derivatives have a strong affinity for carbon nanotube surfaces.

Figure 8:
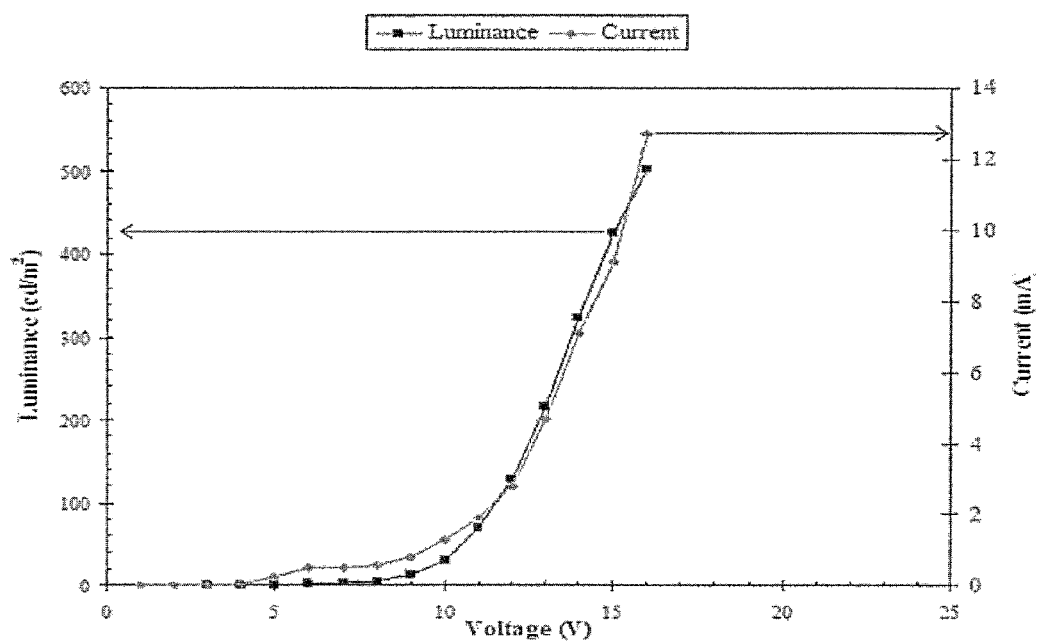
FIG. 8 is a plot of the current-voltage and current-luminance characteristics of an OLED constructed of a Sticky-PF Coated Nanotube Film according to an embodiment of the invention as an anode, MEH-PPV as the emissive polymer, and Ca:Al as the cathode.

FIG. 8 shows current voltage characteristics obtained from an organic light emitting diode (OLED) constructed of a Sticky-PF Coated Nanotube Film according to the invention where MEH-PPV is the emissive layer, and calcium and aluminum metal is the cathode. Under forward bias, the device begins to emit light at a low turn-on voltage of about 3V, and continued to emit light up to about 16 Volts. Initial results with Sticky-PF Coated Nanotube Films outperformed devices of similar construction using bare nanotubes, or nanotubes coated with parylene.

Figure 9:
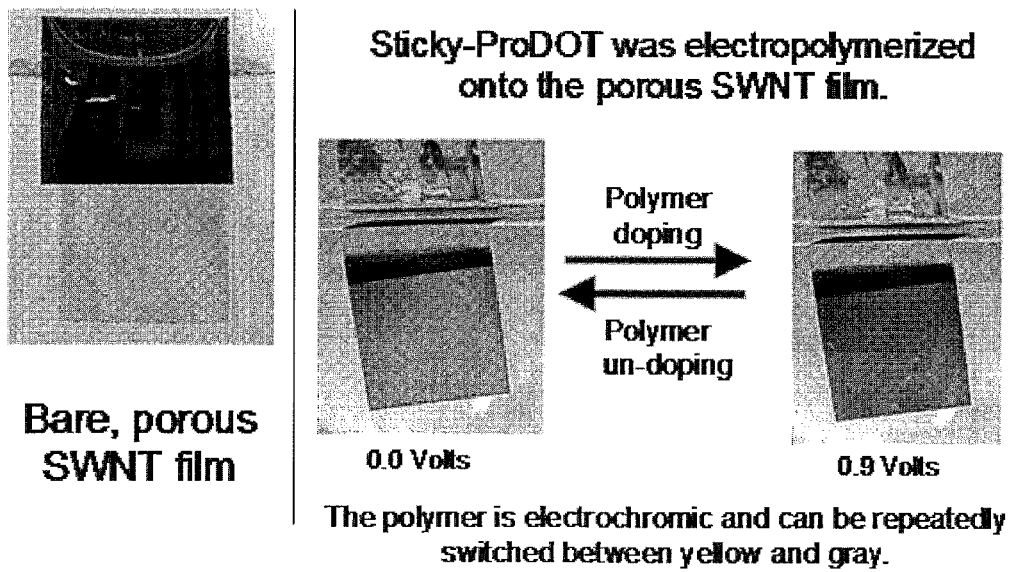
FIG. 9 are images demonstrating an exemplary usage of an embodiment of the Invention. Left: a bare single-wall nanotube film. Right: electrochromic switching of Poly(StickyProDOT) as a Coated Nanotube Film.

FIG. 9 demonstrates usage of a Coated Nanotube Film in an electrochromic device as a proof-of concept experiment. The left image is of a bare (uncoated) single-wall nanotube film. The right image shows electrochromic switching of Poly(StickyProDOT) as a Coated Nanotube Film. The yellow film of Poly(StickyProDOT) was prepared as described in the above Process. It was found that the film could be repeatedly cycled between yellow and gray colors (by cycling the applied voltage) where the Sticky Polymer as a Coated Nanotube Film exhibits use as an electrochromic device.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. A composition of matter, comprising:
an electroactive polymer having a backbone including at least one conjugated block;
a plurality of pendant binding groups comprising at least one polycyclic aromatic group selected from the group consisting of anthracene, pentacene, ovalene, perylene, pentaphene, corannulene, tetracene, benzo[rst]pentaphene, benzo[pqr]tetraphene, dibenzo[c,pqr]tetraphene, dibenzo[f,pqr]tetraphene, naphtho[1,2,3,4-pqr]tetraphene, naphtho[2,1,8-qra]tetracene, benzo[k]tetraphene, tribenzo[c,f,pqr]tetraphene, benzo[g]chrysene, dibenzo[h,rst]pentaphene, benzo[c]chrysene, tetraphene, chrysene, benzo[c]phenanthrene, dibenzo[a,j]anthracene, benzo[f]tetraphene, benzo[e]pyrene, phenanthrene, triphenylene, benzo[a]tetracene, dibenzo[c,g]phenanthrene, picene, dibenzo[f,k]tetraphene, dibenzo[fg,op]tetracene, benzo[c]pentaphene, benzo[a]pentacene, naphtho[7,8,1,2,3-nopqr]tetraphene, pyrene, benzo[ghi]perylene, coronene, or any combination thereof, wherein said pendant binding groups are capable of binding non-covalently to a carbon nanotube or a graphite-like structure; and
a non-conjugated linking moiety consisting of a $C_1$-$C_{12}$ alkylene chain uninterrupted or interrupted by one or more oxygen atoms connecting said pendant binding group to said backbone.

2. The composition of claim 1, wherein said polycyclic aromatic group contains at least one heteroatom selected from the group consisting of O, S, N, P, B and Si.

3. The composition of claim 1, wherein said polymer backbone is fully conjugated.

4. The composition of claim 1, wherein said backbone includes aromatic units.

5. The composition of claim 1, wherein said conjugated block of said polymer backbone comprises polythiophene, polypyrrole, polydioxythiophene, polydioxypyrrole, polyfluorene, polycarbazole, polyfuran, polydioxyfuran, polyacetylene, poly(phenylene), poly(phenylene-vinylene), polyaniline, polypyridine, substituted variations thereof, or copolymers thereof.

6. The composition of claim 1, wherein said polymer is an electrically conductive polymer.

7. The composition of claim 1, wherein said polymer is a block copolymer.

8. The composition of claim 1, wherein said polymer comprises poly(3,4-alkylenedioxythiophene).

9. The composition of claim 1, further comprising a plurality of carbon nanotubes, wherein at least one of said pendant binding groups is non-covalently bound to a surface of said carbon nanotubes.

10. The composition of claim 9, wherein said nanotubes are bound exclusively to said electroactive polymer by non-covalent bonds to said pendant groups.

11. The composition of claim 9, wherein said nanotubes are bound to said electroactive polymer by non-covalent bonds to said pendant groups and to said conjugated blocks.

12. The composition of claim 9, wherein nanotubes are uniformly coated by said composition of matter recited in claim 1.

13. A method to prepare electroactive polymer coated nanotubes comprising the steps of:
  providing a solution of the electroactive polymer according to claim 1;
  dispersing a plurality of carbon nanotubes in said solution of said electroactive polymer; and
  filtering said dispersion wherein a filtrate of electroactive polymer coated nanotubes is supported on a filter.

14. The method of claim 13, further comprising the step of washing said filtrate with a solvent.

15. A method to prepare an electroactive polymer coated nanotubes film comprising the steps of:
  providing a film comprising a plurality of carbon nanotubes on a substrate; and
  wetting said film with a solution of the electroactive polymer according to claim 1.

16. The method of claim 15, further comprising the step of washing said wetted film on said support to remove excess of said electroactive polymer.

17. The method of claim 15, further comprising the step of drying said wetted film.

18. The composition of claim 1, wherein said polycyclic aromatic group is selected from the group consisting of pentacene, ovalene, perylene, pentaphene, corannulene, tetracene, benzo[rst]pentaphene, benzo[pqr]tetraphene, dibenzo[c,pqr]tetraphene, dibenzo[f,pqr]tetraphene, naphtho[1,2,3,4-pqr]tetraphene, naphtho[2,1,8-qra]tetracene, benzo[k]tetraphene, tribenzo[c,f,pqr]tetraphene, benzo[g]chrysene, dibenzo[h,rst]pentaphene, benzo[c]chrysene, tetraphene, chrysene, benzo[c]phenanthrene, dibenzo[a,j]anthracene, benzo[f]tetraphene, benzo[e]pyrene, triphenylene, benzo[a]tetracene, dibenzo[c,g]phenanthrene, picene, dibenzo[f,k]tetraphene, dibenzo[fg,op]tetracene, benzo[c]pentaphene, benzo[a]pentacene, naphtho[7,8,1,2,3-nopqr]tetraphene, pyrene, benzo[ghi]perylene, coronene, or any combination thereof.

* * * * *